United States Patent

[11] 3,633,118

[72] Inventors Robert W. Means
Los Angeles;
Harper John Whitehouse, Hacienda Heights, both of Calif.

[21] Appl. No. 57,292
[22] Filed July 22, 1970
[45] Patented Jan. 4, 1972
[73] Assignee The United States of America as represented by the Secretary of the Navy

[54] AMPLIFYING SURFACE WAVE DEVICE
10 Claims, 3 Drawing Figs.

[52] U.S. Cl. .......... 330/5.5, 331/107 A, 333/30
[51] Int. Cl. .......... H03f 3/04
[50] Field of Search .......... 330/5.5

[56] References Cited

UNITED STATES PATENTS 3,551,837 12/1970 Speiser et al. .......... 330/5.5

OTHER REFERENCES

Chao, " Applied Physics Letters," 15 May 1970, p. 399-401,

*Primary Examiner*—Roy Lake
*Assistant Examiner*—Darwin R. Hostetter
*Attorneys*—Richard S. Sciascia, Ervin F. Johnston and John Stan

ABSTRACT: A surface wave device upon whose surface an acoustic wave may be made to propagate by the transduction of an electrical signal, which may be applied to the input of the device, comprising a substrate capable of propagating an acoustic surface wave, a conductive structure disposed upon the substrate, and a battery connected to the bus bars at the input to the surface wave device. The conductive structure consists of a pair of sets of linear electrodes, one set interdigitated with the other, and a pair of bus bars connected to opposite ends of the electrodes. Due to the use of the battery, the surface wave device is capable of amplification as well as transduction.

INVENTORS.
ROBERT W. MEANS
HARPER JOHN WHITEHOUSE
BY ERVIN F. JOHNSTON
ATTORNEY.
JOHN STAN, AGENT.

AMPLIFYING SURFACE WAVE DEVICE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to surface wave devices, capable of input signal amplification, of the type wherein an interdigitated electrode structure is disposed upon a semiconductor crystal substrate, for example of piezoelectric material. The conductive electrode structure consists of a pair of sets of linear electrodes which are connected to a pair of opposite bus bars, one set for each bus bar. An input signal may be connected to the bus bars, to be propagated across the substrate.

In the prior art, amplification of an input signal was obtained by the application of a very high direct current voltage at the output side of the electrode structure, and not at the input side, as is true of this invention. The transduction was obtained by the conventional interdigitated structure, while the amplification was obtained at another part of the substrate where the high voltage was applied. In this invention, amplification and transduction are accomplished by the same electrode structure.

Another distinguishing feature of this invention is that the substrate need not be of a semiconductor material, but may be a piezoelectric or ferroelectric material upon which the conductive structure is deposited. A thin film of a semiconductor may then be deposited over the conductive structure and the substrate, for example, by vacuum deposition.

SUMMARY OF THE INVENTION

This invention relates to an amplifying surface wave device upon whose surface an acoustic wave may be made to propagate by the transduction of an electrical signal, which may be applied to the input of the device, comprising a substrate capable of propagating an acoustic surface wave, a conductive structure disposed upon the substrate, and a battery connected at the input to the surface wave device. The low-voltage battery permits amplification of the input electrical signal.

STATEMENT OF THE OBJECTS OF THE INVENTION

It is an object of the invention to provide a surface wave device of the interdigitated electrode type wherein amplification of the input signal is possible.

It is another object of the invention to provide a surface wave device wherein amplification of the input signal is obtained by use of a low-voltage battery, rather than the much higher voltages used in the prior art.

Yet another object of the invention is to provide an amplifying surface wave device wherein the substrate need not be a semiconductor.

Other objects, advantages and novel features of the invention will become apparent from the following detailed description of the invention when considered in conjunction with the accompanying drawings.

DESCRIPTION OF THE PREFERRED EMBODIMENTS

Figure 1:
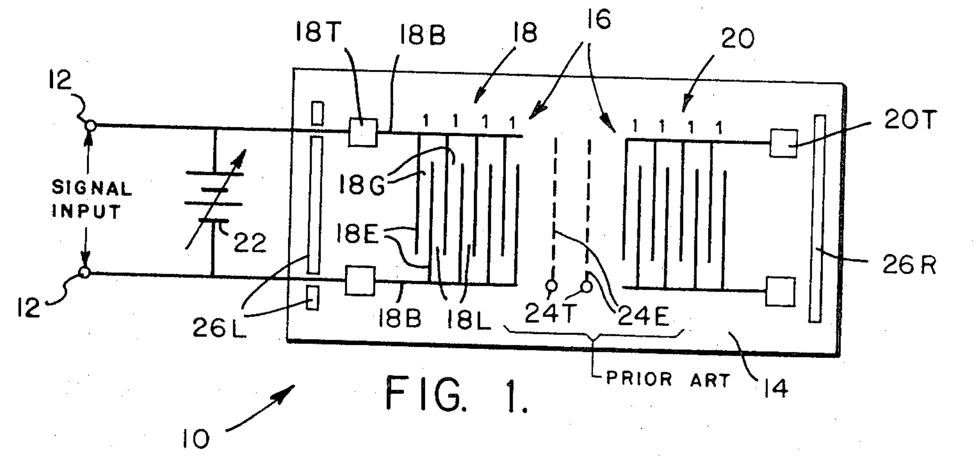
FIG. 1 shows an amplifying acoustic wave device of this invention, including a pair of uncoded, interdigitated, conductive structures.
Figure 3:
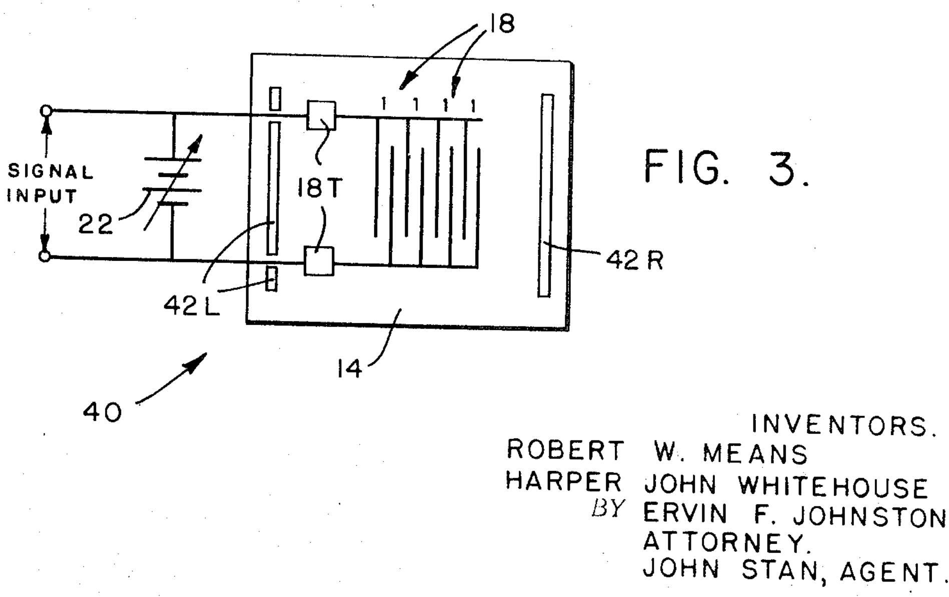
FIG. 3 shows an amplifying acoustic wave device of this invention utilizing only one electrode structure and a pair of reflector stripes.

Discussing now the various embodiments, and beginning with the embodiment shown in FIG. 1, this figure shows a surface wave device 10 upon whose surface an acoustic wave may be made to propagate by the transduction of an electrical signal, which may be applied to the input 12 of the device, comprising a substrate 14 capable of propagating an acoustic surface wave, and a conductive structure 16 disposed upon the substrate. In FIG. 1, the conductive structure consists of a left, input, structure 18 and a right, output, structure 20, but there are applications where only the input structure 18 would be required. An example of such a situation is shown in FIG. 3.

The material of the substrate 14 may be a piezoelectric semiconductor, such as cadmium sulfide CdS, cadmium selenide CdSe, zinc oxide ZnO, gallium arsenide GaAs, and indium antimonide InSb.

Ferroelectrics such as barium titanate $BaTiO_3$, lead-zirconium titanate, and lithium niobate $LiNbO_3$, may also be used for the substrate 14.

The conductive structure 16 may consist of aluminum or some other metal, such as silver, electro- or vacuum-deposited upon the substrate 14.

The electrode structure 16 shown in FIG. 1 is interdigitated in a uniform manner, that is, the structure is uncoded. The structure 18 consists of a pair of sets of linear electrodes 18E, one set interdigitated with the other. A pair of bus bars 18B is connected to opposite ends of the electrodes 18E, one bus bar for each set of electrodes. Similar relations hold for electrode structure 20. Metallized tabs 18T and 20T connect the input and output electrode structures, 18 and 20, respectively, to external circuitry.

A battery 22 connected to the bus bars 18B, by means of connecting tabs 18T, at the input 12 to the surface wave device 10 is an important feature of the invention. The magnitude of the voltage of battery 22 is roughly in the range of 3 volts, and may be varied to obtain maximum output. The low voltage connected across the interdigitated electrodes creates alternate regions 18G and 18L in the substrate 14, which is generally a semiconductor, in which electrons are drifting in opposite directions. If the electrons drift faster than the velocity of the acoustic surface wave, the conductive structures 18 and 20 appear as a series of regions of acoustic gain, for example, at regions 18G of structure 18, and regions of acoustic loss at regions 18L. In the process, energy is transferred from the drifting electrons to the acoustic field through the interaction of the piezoelectric properties of the substrate 14. It can be shown that under these conditions acoustic gain is possible, that is, that the acoustic surface wave caused by the transduction of an electrical signal at the input 12 to the surface wave device 10 is amplified in its passage through the substrate 14.

More specifically, a beam of electrons traveling in the direction of wave propagation produces a gain in such regions. The beam of electrons traveling in the opposite direction to wave propagation produces a loss in such regions. When summing the two beams of electrons, it is possible to get a gain out of the system.

Although FIG. 1 shows two electrode structures 18 and 20 upon one substrate 14, the acoustic wave device 10 is a useful device, and can amplify an input signal at input 12 even with only one conductive structure 18 or 20 present.

A left absorber stripe 26L and a right absorber stripe 26R are generally required to prevent unwanted surface wave reflections off the edges of the substrate 14. A layer of grease may serve as an absorber stripe.

Elaborating upon prior art devices, with references to FIG. 1, acoustic amplification in semiconductors has been obtained outside the transducer structure. For example, see R. M. White, IEEE ED–14 No. 4 (1967), P. 181. This was done on the surface of a piezoelectric semiconductor crystal 14 by placing two electrons 24E, shown dotted, 1.29 cm. apart with a voltage pulse of approximately 1,400 volts applied at terminals 24T. This caused the region between the electrodes 24E to become amplifying.

The limitations and disadvantages of this prior art method are that:

1. high voltages are necessary for gain; and
2. the acoustic surface wave must be propagated on a piezoelectric semiconductor crystal.

Figure 2:
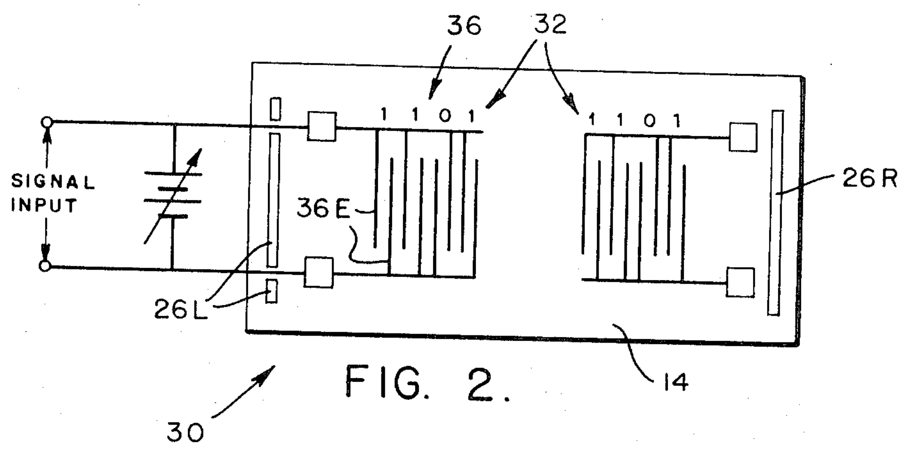
FIG. 2 shows an amplifying acoustic wave device, including a pair of coded, interdigitated, conductive structures.

Referring now to FIG. 2, therein is shown another embodiment 30, similar to the embodiment 10 shown in FIG. 1, except that the interdigitated electrodes 36E of the conductive structure 36 are coded. The specific coding shown is that of a four element Barker code, although other codings may be used.

FIG. 3 shows an embodiment of an acoustic surface wave device 40 which does not have the absorber stripes of FIGS. 1 and 2 and, moreover, includes only one electrode structure 18. In this embodiment 40, a left reflector 42L replaces the left absorber stripe 26L OF FIGS. 1 and 2, while the right absorber stripe 26R is replaced by right reflector stripe 42R. The purpose of the reflectors is to permit obtaining an acoustic beam of limited power. The reflector stripes 42L and 42R may be any metal such as aluminum or silver deposited upon the substrate 14.

When reflectors 42L and 42R are used, one electrode structure 18 is sufficient for the following reason. The surface wave propagating across the surface of the substrate 14 is amplified due to the presence of the battery 22. The amplified signal is then reflected off the right reflector stripe 42R and then propagates toward the left reflector stripe 42L. The reflection coefficient is such that the surface wave builds up in amplitude until it stabilizes at some medium-sized amplitude. An intermittent pulse of a magnitude much greater than the amplitude of the input signal at the input 12 then results, which output may be detected at the metallized tabs 18T.

To summarize the advantages and new features of this invention, the amplifying surface wave devices 10, 30, and 40 combine the transduction and amplification into the same region of the surface of the substrate 14. High voltages are not required since high electrical fields exist within the surface wave devices, inasmuch as the electrode spacing is much less than 1.29 cm., being equal to one wavelength, more or less, and, therefore, a small voltage applied across two adjacent electrodes results in a high electrical field intensity.

The amplification can be done by means of a thin film semiconductor, not necessarily piezoelectric, and thus the acoustic wave is not limited to propagating on the few piezoelectric semiconductors but can propagate on any piezoelectric substrate. Any of the figures may be assumed to also cover the thin film embodiment on a substrate.

Two amplifying transducers separated by a nonactive region can act as a self-limiting ring oscillator which, in conjunction with an external counter, can produce a variable delay line with long time delays.

What is claimed is:

1. A surface wave device upon whose surface an acoustic wave may be made to propagate by the transduction of an electrical signal, which may be applied to the input of the device, comprising:

a substrate capable of propagating an acoustic surface wave;

a conductive structure disposed upon the substrate, comprising:

a pair of sets of linear electrodes, one set interdigitated with the other;

a pair of bus bars connected to opposite ends of the electrodes, one bus bar for each set of electrodes; and a direct current voltage supply connected to the bus bars at the input to the surface wave device;

the voltage having an amplitude such as to cause amplification of the input signal.

2. A surface wave device according to claim 1, wherein:

the DC voltage supply has an amplitude in the range of 3 volts.

3. A surface wave device according to claim 2, further comprising:

an absorber stripe disposed at each end of the substrate, and parallel to the electrodes.

4. A surface wave device according to claim 2, further comprising:

reflector stripes disposed upon the substrate at opposite ends, and parallel to the electrodes.

5. A surface wave device according to claim 2, wherein:

the substrate is a piezoelectric semiconductor.

6. A surface wave device according to claim 2, wherein:

the substrate is a piezoelectric material which is not a semiconductor;

the electrode structure is disposed upon the substrate; and a thin film of a semiconductor having a high mobility and high conductivity is disposed upon the conductive structure and the substrate.

7. A surface wave device according to claim 2, wherein:

the pair of sets of electrodes are interdigitated uniformly, that is, the interdigitations are uncoded.

8. A surface wave device according to claim 2, wherein:

the pair of sets of electrodes are interdigitated in a coded manner.

9. A surface wave device according to claim 7, wherein the conductive structure is an input conductive structure; and further comprising:

an output conductive structure substantially identical to the input conductive structure, both conductive structures being aligned in the direction of acoustic wave propagation.

10. A surface wave device according to claim 8, wherein the conductive structure is an input conductive structure; and further comprising:

an output conductive structure substantially identical to the input conductive structure, both conductive structures being aligned in the direction of acoustic wave propagation.

* * * * *